(12) United States Patent  (10) Patent No.: US 8,999,623 B2
Gopalan et al.  (45) Date of Patent: Apr. 7, 2015

(54) DEGRADABLE NEUTRAL LAYERS FOR BLOCK COPOLYMER LITHOGRAPHY APPLICATIONS

(71) Applicant: Wisconsin Alumni Research Foundation, Madison, WI (US)

(72) Inventors: Padma Gopalan, Madison, WI (US); Daniel Patrick Sweat, Madison, WI (US); Jonathan Woosun Choi, Madison, WI (US); Myungwoong Kim, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 2 days.

(21) Appl. No.: 13/831,193

(22) Filed: Mar. 14, 2013

(65) Prior Publication Data

US 2014/0263164 A1   Sep. 18, 2014

(51) Int. Cl.
| | |
|---|---|
| *G03C 1/00* | (2006.01) |
| *G03F 7/00* | (2006.01) |
| *B32B 27/30* | (2006.01) |
| *B82Y 30/00* | (2011.01) |
| *C09D 153/00* | (2006.01) |

(52) U.S. Cl.
CPC .............. *B32B 27/30* (2013.01); *B82Y 30/00* (2013.01); *C09D 153/00* (2013.01); *B81C 2201/0149* (2013.01)

(58) Field of Classification Search
None
See application file for complete search history.

(56) References Cited

U.S. PATENT DOCUMENTS

| | | | | |
|---|---|---|---|---|
| 5,459,174 | A | * | 10/1995 | Merrill et al. .................... 522/35 |
| 5,591,551 | A | * | 1/1997 | Audett et al. .................... 430/18 |
| 5,712,078 | A | | 1/1998 | Huang et al. |
| 6,416,928 | B1 | | 7/2002 | Ohsawa et al. |
| 6,440,634 | B1 | | 8/2002 | Ohsawa et al. |
| 7,223,517 | B2 | | 5/2007 | Babich et al. |
| 7,261,992 | B2 | | 8/2007 | Sooriyakumaran et al. |
| 7,521,090 | B1 | | 4/2009 | Cheng et al. |
| 7,521,094 | B1 | | 4/2009 | Cheng et al. |

(Continued)

FOREIGN PATENT DOCUMENTS

| | | |
|---|---|---|
| EP | 628876 | 12/1994 |
| EP | 1528430 | 5/2005 |

(Continued)

OTHER PUBLICATIONS

Pillai et al., Synthesis of thioredoxin partial sequences on a polyethyleneglycol-grafted polystyrene support with a photolytically detachable 2-nitrobenzyl anchoring group, Indian Journal of Chemistry, vol. 30B, Feb. 1991, pp. 205-212.

(Continued)

*Primary Examiner* — Duy Deo
(74) *Attorney, Agent, or Firm* — Bell & Manning, LLC

(57) ABSTRACT

Polymer films comprising crosslinked random copolymers and methods for making the films are provided. Also provided are polymer films comprising random copolymers that are covalently linked to an underlying substrate. The polymer films can be incorporated into structures in which the films are employed as surface-modifying layers for domain-forming block copolymers and the structures can be used for pattern transfer applications via block copolymer lithography. The crosslinks between the random copolymer chains in the polymer films or the links between the random copolymer chains and the substrate surface are characterized in that they can be cleaved under relatively mild conditions.

23 Claims, 14 Drawing Sheets

(56) References Cited

U.S. PATENT DOCUMENTS

| | | | |
|---|---|---|---|
| 7,550,254 | B2 | 6/2009 | Sooriyakumaran et al. |
| 7,691,558 | B2 | 4/2010 | Wada |
| 7,790,350 | B2 | 9/2010 | Breyta et al. |
| 7,901,864 | B2 | 3/2011 | Huang et al. |
| 7,943,452 | B2 | 5/2011 | Li et al. |
| 7,959,975 | B2 | 6/2011 | Millward |
| 8,101,261 | B2 | 1/2012 | Millward et al. |
| 8,226,838 | B2 | 7/2012 | Cheng et al. |
| 8,268,180 | B2 | 9/2012 | Arnold et al. |
| 8,273,668 | B2 | 9/2012 | Yoon et al. |
| 8,362,179 | B2 | 1/2013 | Gopalan et al. |
| 8,486,613 | B2 | 7/2013 | Kim et al. |
| 2001/0002323 | A1 | 5/2001 | Kobayashi et al. |
| 2001/0014420 | A1 | 8/2001 | Takeuchi et al. |
| 2005/0147920 | A1 | 7/2005 | Lin et al. |
| 2008/0093422 | A1 | 4/2008 | Kodas et al. |
| 2009/0075002 | A1 | 3/2009 | Kim et al. |
| 2009/0111703 | A1 | 4/2009 | Gopalan |
| 2010/0055606 | A1 | 3/2010 | Mimura et al. |
| 2010/0056748 | A1 | 3/2010 | Yano |
| 2010/0093901 | A1* | 4/2010 | Kawaguchi et al. .......... 524/189 |
| 2010/0124629 | A1 | 5/2010 | Gopalan et al. |
| 2010/0151393 | A1 | 6/2010 | Kim et al. |
| 2011/0102528 | A1 | 5/2011 | Tsuchimura et al. |
| 2011/0201201 | A1 | 8/2011 | Arnold et al. |
| 2012/0088188 | A1 | 4/2012 | Trefonas et al. |
| 2012/0088192 | A1 | 4/2012 | Trefonas et al. |
| 2012/0116007 | A1 | 5/2012 | Gopalan et al. |
| 2012/0237880 | A1 | 9/2012 | Sills et al. |
| 2012/0251950 | A1 | 10/2012 | Horiguchi et al. |
| 2012/0285929 | A1 | 11/2012 | Matsumura et al. |
| 2013/0078576 | A1 | 3/2013 | Wu et al. |

FOREIGN PATENT DOCUMENTS

| | | |
|---|---|---|
| KR | 20080101666 | 11/2008 |
| KR | 20100089021 | 8/2010 |
| WO | WO2008/147044 | 12/2008 |
| WO | WO2012/148884 | 11/2012 |
| WO | WO2013/104499 | 7/2013 |

OTHER PUBLICATIONS

Schumers et al., Synthesis and Self-Assembly of Diblock Copolymers Bearing 2-Nitrobenzyl Photocleavable Side Groups, Journal of Polymer Science Part A: Polymer Chemistry, vol. 50, Nov. 9, 2011, pp. 599-608.

Song et al., Functionalized Soft Nanoporous Materials through Supramolecular Assembly of End-Functionalized Polymer Blends, Chem. Eur. J., vol. 18, Oct. 25, 2012, pp. 15662-15668.

Suh et al., Orientation of Block Copolymer Resists on Interlayer Dielectrics with Tunable Surface Energy, Macromolecules, vol. 43, Nov. 13, 2009, pp. 461-466.

S. Thomas III, New Applications of Photolabile Nitrobenzyl Groups in Polymers, Macromol. Chem. Phys., vol. 213, Dec. 13, 2012, pp. 2443-2449.

Yamada et al., Positive and Negative Tone Water Processable Photoresists: A Progress Report, Advances in Resist Technology and Processing XV, Santa Clara, CA, Feb. 23, 1998, pp. 245-253.

Beecher et al., Photogeneration of Polymeric Amines: Synthesis, Photocrosslinking and Photoimaging of Copolymers containing Photoactive Carbamate Pendant Groups, J. Mater. Chem., vol. 2, 1992, pp. 811-816.

Kim et al., Surface Energy Modification by Spin-Cast, Large-Area Graphene Film for Block Copolymer Lithography, ACS Nano, vol. 4, Aug. 25, 2010, pp. 5464-5470.

Liu et al., Modification of a polystyrene brush layer by insertion of poly(methylmethacrylate) molecules, J. Vac. Sci. Technol. B, vol. 27, Nov. 2009, pp. 3038-3042.

Matuszczak et al., Photogenerated Amines and their Use in the Design of a Positive-tone Resist Material based on Electrophilic Aromatic Substitution, J. Mater. Chem., vol. 1, 1991, pp. 1045-1050.

Peters et al., Morphology of Thin Films of Diblock Copolymers on Surfaces Micropatterned with Regions of Different Interfacial Energy, Macromolecules, vol. 35, Jan. 26, 2002, pp. 1822-1834.

Palmieri et al., Design of Reversible Cross-Linkers for Step and Flash Imprint Lithography Imprint Resists, ACS Nano, vol. 1, No. 4, Nov. 30, 2007, pp. 307-312.

Heath et al., Degradable Cross-Linkers and Strippable Imaging Materials for Step-and-Flash Imprint Lithography, Macromolecules, vol. 41, Jan. 1, 2008, pp. 719-726.

Moon et al., Three-component photoresists based on thermal crosslinking and acidolytic cleavage, Polymer, vol. 41, 2000, pp. 4013-4019.

Zhao et al., o-Nitrobenzyl Alcohol Derivatives: Opportunities in Polymer and Materials Science, Macromolecules, vol. 45, Jan. 26, 2012, pp. 1723-1736.

Somervell et al., Comparison of Directed Self-Assembly Integrations, Advances in Resist Materials and Processing Technology XXIX. Edited by Somervell, Mark H.; Wallow, Thomas I. Proceedings of the SPIE, vol. 8325, article id. 83250G, 14 pp. (2012).

Keen et al., Control of the Orientation of Symmetric Poly(styrene)-blockpoly(D,L.lactide) Block Copolymers Using Statistical Copolymers of Dissimilar Composition, Langmuir, vol. 28, Oct. 22, 2012, pp. 15876-15888.

Liu et al., Fabrication of Lithographically Defined Chemically Patterned Polymer Brushes and Mats, Macromolecules, vol. 44, Mar. 18, 2011, pp. 1876-1885.

Liu et al., Integration of block copolymer directed assembly with 193 immersion lithography, J. Vac. Sci. Technol. B, vol. 28, No. 6, Nov. 30, 2010, pp. C6B30-C6B34.

In et al., Side-Chain-Grafted Random Copolymer Brushes as Neutral Surfaces for Controlling the Orientation of Block Copolymer Microdomains in Thin Films, Langmuir, vol. 22, No. 18, Aug. 1, 2006, pp. 7855-7860.

Han et al., Effect of Composition of Substrate-Modifying Random Copolymers on the Orientation of Symmetric and Asymmetric Diblock Copolymer Domains, Macromolecules, vol. 41, Nov. 6, 2008, pp. 9090-9097.

Han et al., Cross-Linked Random Copolymer Mats as Ultrathin Nonpreferential Layers for Block Copolymer Self-Assembly, Langmuir, vol. 26, Sep. 30, 2009, pp. 1311-1315.

Han et al., Photopatternable Imaging Layers for Controlling Block Copolymer Microdomain Orientation, Adv. Mat., vol. 19, 2007, pp. 4448-4452.

Han et al., Perpendicular Orientation of Domains in Cylinder-Forming Block Copolymer Thick Films by Controlled Interfacial Interactions, Macromolecules, vol. 42, Jun. 11, 2009, pp. 4896-4901.

M. Keegstra, Copper Catalysed Preparation of Vinyl Ethers from Unactivated Vinylic Halides, Tetrahedron, vol. 48, No. 13, 1992, pp. 2681-2690.

Trenor et al., Photoreversible Chain Extension of Poly(ethylene glycol), Macromol. Chem. Phys., vol. 205, 2004, pp. 715-723.

* cited by examiner

DEGRADABLE NEUTRAL LAYERS FOR BLOCK COPOLYMER LITHOGRAPHY APPLICATIONS

REFERENCE TO GOVERNMENT RIGHTS

This invention was made with government support under 0832760 awarded by the National Science Foundation. The government has certain rights in the invention.

BACKGROUND

Self-assembly of block copolymers (BCPs) in thin films provides a large area, high throughput route to creating dense nano-structures with length scales not easily achievable by traditional lithography processes. BCP lithography is widely accepted by the industry as one of the solutions to achieve sub 20 nm nodes. While there are many approaches to controlling domain morphology in BCP lithography, the use of surface modifying random copolymers as neutral layers is commonly employed.

Unfortunately, while the neutral copolymer chemistry is essential to control domain orientation in BCPs, the neutral layers constitute an additional layer to bore through during BCP template formation and leave organic residues on the substrate after nanopatterning. Moreover, the strong reactive ion etchants needed to remove the organic BCP template structures and the underlying neutral layers can damage the underlying substrate.

SUMMARY

Polymer films comprising crosslinked random copolymers are provided. Also provided are polymer films comprising random copolymers that are covalently linked to an underlying substrate. Methods of making the copolymer films and methods of using the copolymer films as surface-modifying layers in block copolymer (BCP) lithography applications are also provided.

One embodiment of a method of forming a self-assembled block copolymer film comprises the steps of: forming a crosslinked copolymer film on a substrate surface, the crosslinked copolymer film comprising crosslinked random copolymer chains, wherein the crosslinks comprise photocleavable junctions or mild acid-cleavable junctions; depositing a domain-forming block copolymer over the crosslinked copolymer film; and subjecting the domain-forming block copolymer to conditions that induce the block copolymer to self-assemble into a pattern of block copolymer domains.

Another embodiment of a method of forming a self-assembled block copolymer film comprises the steps of: forming a copolymer film on a substrate surface, the copolymer film comprising random copolymer chains, wherein the random copolymer chains are bonded to the surface at multiple points by surface links and further wherein the surface links comprise photocleavable junctions or mild acid-cleavable junctions; depositing a domain-forming block copolymer over the surface-linked copolymer film; and subjecting the domain-forming block copolymer to conditions that induce the block copolymer to self-assemble into a pattern of block copolymer domains.

Some embodiments of the copolymer films provide neutral layers for vertical domain formation in the domain-forming block copolymer in BCP lithography applications in which one or more domains are selectively removed from the block copolymer, along with the portions of the copolymer films underlying said domains, to form a pattern over the substrate and the pattern is subsequently transferred to the substrate. The step of selectively removing the portions of the copolymer film underlying said domains may comprise exposing said portions to radiation having wavelengths that cleave photocleavable junctions in the crosslinks, such that the random copolymer chains are uncrosslinked, and removing the uncrosslinked random copolymer chains from the substrate surface. Alternatively, the step of selectively removing the portions of the copolymer film underlying said domains may comprise exposing said portions to a mild acid that cleaves mild acid-cleavable junctions in the crosslinks, such that the random copolymer chains are uncrosslinked, and removing the uncrosslinked random copolymer chains from the substrate surface.

The step of forming a crosslinked copolymer film on the substrate surface may be carried out by: depositing a coating comprising the random copolymer chains onto a substrate surface, wherein the random copolymer chains comprise comonomers comprising crosslinkable functional groups; and subjecting the coating to conditions that induce crosslinking reactions between the crosslinkable functional groups to form the crosslinks. The crosslinking reactions may be carried out with or without the aid of a crosslinking agent.

The step of forming a surface-linked copolymer film on the substrate surface may be carried out by: depositing a coating comprising the random copolymer chains onto a substrate surface, wherein the random copolymer chains comprise comonomers comprising surface-linkable functional groups; and subjecting the coating to conditions that induce surface-linking reactions between the surface-linkable functional groups to form the crosslinks. The surface-linking reactions may be carried out with or without the aid of a linking agent.

Also provided are crosslinkable monomers and random copolymer incorporating said monomers. The monomers and copolymers are characterized in that they form crosslinks that are cleavable under mild conditions. As such, the monomers and random copolymers are useful in a broad range of applications. Examples of the monomers include: monomers having a 7-hydroxycoumarin group derivitized with a (meth)acrylate functionality, monomers having a 2-nitrobenzyl group, wherein the aromatic ring is functionalized with an epoxy-group and also with a (meth)acrylate group, and monomers having a triphenylmethyl(trityl) ether group that is functionalized with a hydroxyl group and a (meth)acrylate group. Illustrative structures for each of these types of molecules include:

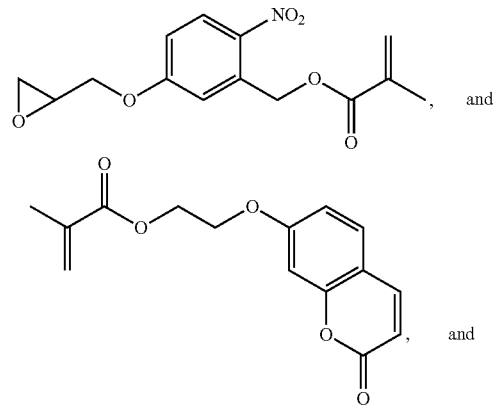

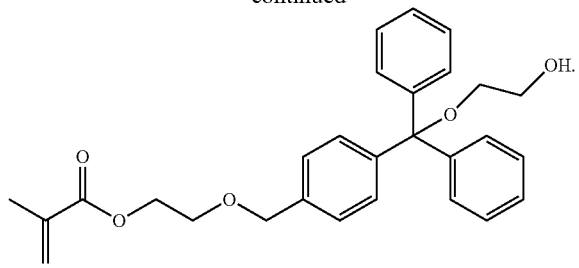

Random copolymers incorporating these monomers include those comprising vinyl and (meth)acrylate monomer.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
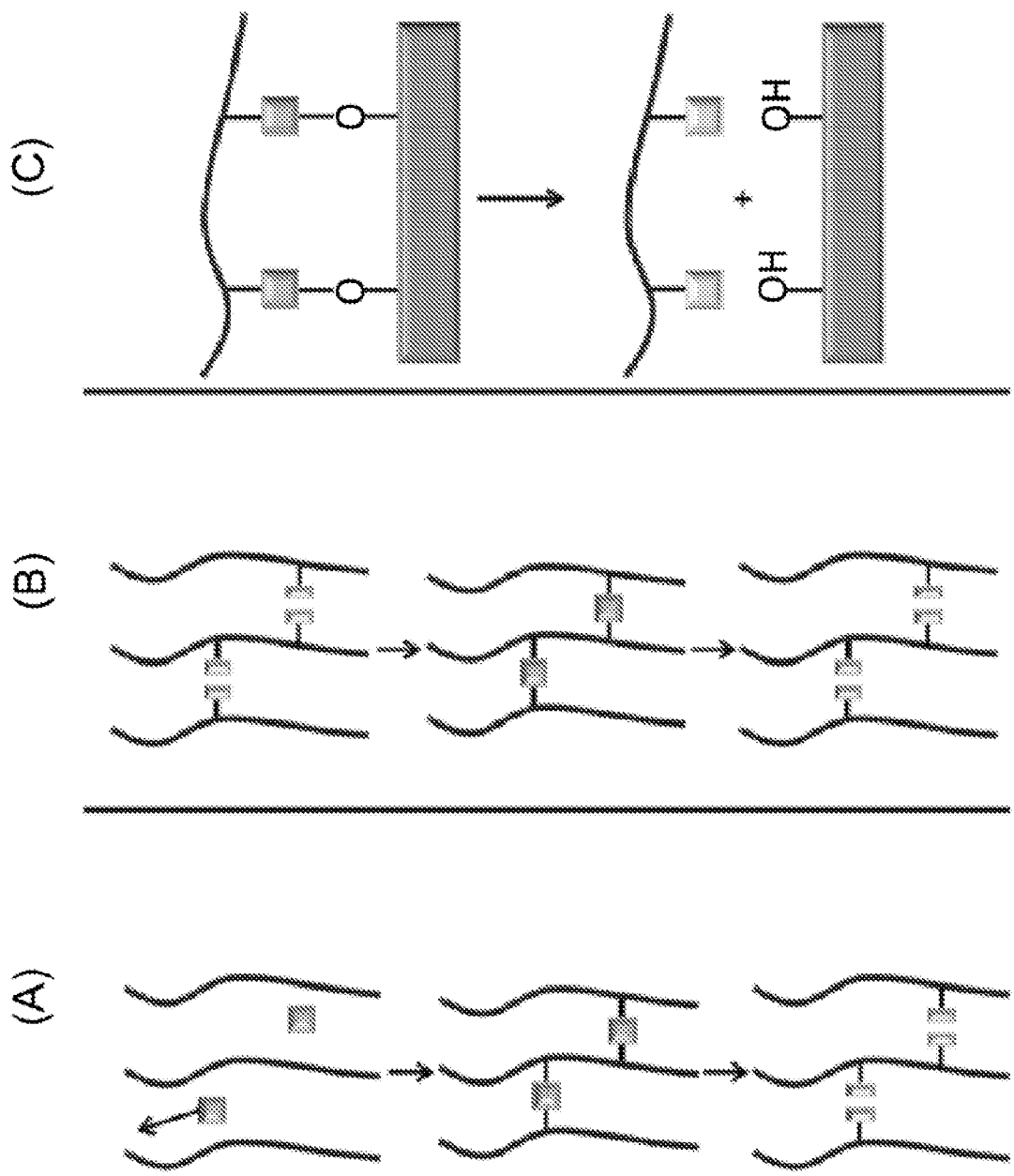
FIG. 1 is a schematic illustration of: (A) a process for crosslinking and uncrosslinking a random copolymer film using a cleavable molecular crosslinking agent; (B) a process for crosslinking and uncrosslinking a random copolymer film comprising random copolymers having cleavable side chains; and (C) a process for linking and unlinking a random copolymer film to a substrate using random copolymers having cleavable side chains.

Polymer films comprising crosslinked random copolymers and methods for making the films are provided. Also provided are polymer films comprising random copolymers that are covalently linked to an underlying substrate. The polymer films can be incorporated into template structures for block copolymer (BCP) lithography in which the films are employed as surface-modifying layers for domain-forming block copolymers. The crosslinks between the random copolymer chains in the polymer films or the molecular links between the random copolymer chains and the substrate surface are characterized in that they can be cleaved under relatively mild conditions. For example the crosslinks or molecular links may be photocleavable or cleavable using only a mild acid or base. As a result, the polymer films can be readily converted from stable films that are insoluble in a wide array of organic solvents into destabilized polymeric layers that are more readily removed from an underlying substrate. As such, the polymer films are well-suited for applications, such as block copolymer lithography, in which it is desirable to avoid harsh polymer film lift-off techniques, such as reactive ion etching, that can negatively affect the electrical or magnetic properties of the underlying substrate. Although a variety of cleavable junctions can be used, the junctions are desirably stable at temperatures used to anneal block copolymer films in BCP lithography applications. Thus, for such applications, cleavable junctions that are stable at temperatures of at least 150° C., and preferable up to at least 250° C. are preferred.

As used herein, the phrase "mild conditions" refers to conditions that do not significantly negatively affect the electronic or magnetic properties of the underlying substrates or significantly disrupt the pattern in an overlying self-assembled block copolymer template. Photocleavable junctions that are cleavable under mild conditions include, but are not strictly limited to, those that are cleaved by radiation of wavelengths shorter than 254 nm. Similarly, acid-cleavable junctions that are cleavable under mild conditions include, but are not strictly limited to, those that are cleaved by acids having a pKa higher than that of trifluoroacetic acid. Moreover, despite the mild cleavage conditions, cleavage of the cleavable junctions many occur within a matter of minutes, typically 10 or fewer minutes.

Two approaches can be used to fabricate the crosslinked copolymer films. The first approach starts with random copolymer chains that have side chains comprising a crosslinkable functional group and a functional group that provides a readily-cleavable junction. (This junction may be present in the side chain prior to crosslinking or may form as a result of the crosslinking reaction.) Random copolymers of this type are shown schematically in the top panel of FIG. 1(B), in which the solid wavy lines represent the backbones of the random copolymer chains and the rectangles extending from the lines represent pendant groups having crosslinkable functionalities. As shown in the middle panel of FIG. 1(B), random copolymers of this type can be crosslinked to form a stable film via direct crosslinking reactions between the pendant crosslinkable functional groups on the random copolymer chains.

The second approach, illustrated schematically in FIG. 1(A), employs multifunctional (e.g., difunctional) molecular crosslinking agents (represented by squares). As shown in the middle panel of FIG. 1(A), random copolymers of this type can be crosslinked to form a stable film via crosslinking reactions between pendant crosslinkable groups on the random copolymer chains and crosslinkable groups on the molecular crosslinking agent. (For the purposes of this disclosure a functional group is considered to be a crosslinkable functional groups if it is able to undergo crosslinking reactions via direct reactions with pendant groups on other polymer chains, or if it is able to form crosslinks through a molecular crosslinking agent.)

In some embodiments, the random copolymer chains are side-chain grafted to the surface of a substrate at multiple points along their chains instead of (or in addition to) being crosslinked, in order to provide a stable random copolymer film. In these embodiments the molecular groups that link the random copolymer chains to the substrate surface (referred to herein as surface links, surface linkers or surface linkages) can be synthesized using two approaches analogous to those used to form crosslinks in the crosslinked films. Thus, the first approach starts with random copolymer chains that have side chains comprising a surface linkable functional group (that is, a functional group capable of forming a covalent linkage with a surface functional group) and a functional group that provides a readily-cleavable junction. As shown in the top panel of FIG. 1(C), random copolymers of this type can be surface-linked to form a stable film via direct covalent bond-forming reactions between pendant surface linkable functional groups on the random copolymer chains and functional groups on the surface of the substrate.

In the second approach, the random copolymer chains are side-chain grafted to the substrate surface using a multifunctional (e.g., difunctional) molecular surface linking agent. Random copolymers of this type can be surface linked to form a stable film via covalent bond forming reactions (also referred to as linking reactions) between pendant surface-linkable groups on the random copolymer chains, functional groups on the substrate surface, and crosslinkable groups on the molecular surface linking agent. (For the purposes of this disclosure a functional group is considered to be a surface linkable functional group if it is able to undergo linking reactions via direct reactions with surface functional groups, or if it is able to form molecular linkages to the surface through a molecular surface linking agent.)

Terms such as "(cross)linking", "(cross)linker", "(cross)linkable" and the like, used throughout the remainder of this disclosure, mean crosslinking, crosslinker, crosslinkable, and the like, with respect to the embodiments of the random copolymer films in which the random copolymer chains are crosslinked. These same terms mean surface-linking, surface-linker (i.e., a molecular linkage between a random copolymer chain and a surface), and surface-linkable (i.e., able to form a molecular linkage between a random copolymer chain and a surface), and the like, with respect to the embodiments of the random copolymer films in which the random copolymer chains are multi-point side-chain grafted to a substrate surface.

The (cross)linking can be carried out on a substrate surface by spreading the random copolymers on the surface using, for example, spin-coating techniques and then inducing the (cross)linking reactions. In those embodiments that employ a multifunctional (cross)linking agent, a solution comprising the random copolymers and the molecular (cross)linking agent can be spread on surface. The (cross)linkable functional groups may be thermally (cross)linkable or photo(cross)linkable groups. If the random copolymers comprise thermally (cross)linkable groups, (cross)linking may be induced by subjecting the copolymers to a thermal anneal. While, if photo(cross)linkable groups are used, (cross)linking may be induced by exposing the copolymers to radiation of an appropriate wavelength.

Enough of the random copolymer can be deposited onto the substrate surface to achieve a desired thickness for the (cross)linked film. If the random copolymer film is intended for use in block copolymer lithography applications, the (cross)linked random copolymer film is desirably selected such that its chemical composition, rather than film thickness, controls the orientation of the domains in the overlying block copolymer. For example, in some embodiments, the random copolymer films have a thickness in the range from about 2 nm to about 20 nm. This includes embodiments of the films having a thickness in the range from about 2 nm to about 10 nm and further includes embodiments of the films having a thickness in the range from about 2 nm to about 8 nm. However, thicknesses outside of these ranges may also be used. Generally, very thin crosslinked films (e.g., those having a thickness of about 6 nm or less) will benefit from a higher crosslinking density in order to improve their stability against delamination from the surface of the underlying substrate.

The crosslinked random copolymer films can be crosslinked on a variety of substrates and do not need to form covalent bonds with the substrates to achieve stability against delamination. Thus, although covalent bonds may be formed between the random copolymers and the underlying substrate in some instances (as in the case where the substrate comprises an oxide), in some embodiments there is no covalent bonding between the crosslinked films and the underlying substrate.

Examples of substrate materials on which the (cross)linked films may be formed include graphene, metals, metal alloys, metal oxides, semiconductors, semiconductor oxides and ceramics. Specific examples include silicon, silicon dioxide, GaAs, noble metals, such as gold and platinum, copper, aluminum, titanium, glass, indium-tin-oxide (ITO) coated glass and magnesium oxide. The substrate surfaces upon which the films are formed may be planar or non-planar surfaces. The random copolymer films are particularly useful for low-k dielectric materials, the dielectric constants of which can be altered via surface oxidation under harsh etching conditions.

Once the random copolymer films have been formed, they can be uncrosslinked (or unlinked from the substrate) by cleaving crosslinks between random copolymer chains or by cleaving the molecular links between the random copolymer chains and the substrate. The readily cleavable junctions in the crosslinks or molecular links can be photocleavable, mild acid-cleavable, or both. For example, in some embodiments the photocleavable junctions are UV-cleavable, such that the bond cleavage can be achieved by exposing the random copolymer films to UV radiation (i.e., radiation having wavelengths in the range from 10 nm to 400 nm). 2-nitrobenzyl groups are an example of a suitable UV-cleavable junction-containing group that can be incorporated into the (cross) links. Coumarin is another example.

In other embodiments, the cleavable junctions incorporated into the crosslinks or the molecular links between the copolymers and the substrate surface are cleavable using a mild acid or a mild base. Examples of acid-cleavable groups include acetal groups and triphenylmethyl(trityl) ether groups. Examples of mild acids that could be used to cleave the crosslinks include, but are not limited to, acetic acid, diluted solutions of trifluoroacetic acid, oxalic acid, p-toluenesulfonic acid, methanesulfonic acid, hydrochloric acid, hydrobromic acid, hydroiodic acid, sulfuric acid, nitric acid and trifluoromethanesulfonic acid. The stronger the acid is, the more dilute the solution can be. Dilution is desirably accomplished in either aqueous or alcoholic solutions to avoid damage to the overlying block copolymer layer.

The random copolymers can be polymerized from vinyl monomers, such as styrene monomers, and (cross)linkable monomers and, optionally, one or more additional monomers, such as acrylates and methacrylates. The vinyl monomers and (meth)acrylate monomers may be functionalized or unfunctionalized. For example, if the random copolymer films are intended for BCP lithography applications, the comonomers should be selected to provide the appropriate surface energy and wetting behavior for the overlying block copolymer. Typically, this is accomplished by selecting comonomers that match the composition of the overlying block copolymer. For example, if the random copolymer film is to be used as a surface-modifying layer for a block copolymer of styrene and methyl methacrylate (P(S-b-MMA)), the random copolymer may be a terpolymer of styrene, methyl methacrylate and a (cross)linkable monomer. Alternatively, if the random copolymer film is to be used as a surface-modifying layer for a block copolymer of styrene and 2-vinyl pyridine (P(S-b-2VP)), the random copolymer may be a terpolymer of styrene, 2-vinyl pyridine and a (cross)linkable monomer.

The (cross)linkable monomers employed as comonomers in the random copolymer synthesis comprise a (cross)linkable functional group and a monomer fragment. The monomer fragment is a portion of the monomer having a functional group that is polymerized into the copolymer backbone chain. Suitable monomer fragments include acrylates and methacrylates (collectively "(meth)acrylates") and styrenes. As noted above, the (cross)linkable functional groups may be thermally (cross)linkable groups (i.e., wherein (cross)linking is induced by heating) or photo(cross)linkable groups (i.e., wherein (cross)linking is induced by radiation), such as UV-(cross)linkable groups. However, if the cleavable junction in the crosslink or the link to the surface is a photocleavable junction, it may be desirable to use a thermally (cross)linkable functionality. Alternatively, a reversibly photo(cross) linkable-photocleavable junction can be used, wherein photo (cross)linking and photocleavage are induced at different wavelengths.

Epoxy groups are an example of a suitable crosslinkable group. The monomer fragment of the crosslinkable epoxy-functional monomer may comprise, for example, a styrene group or a (meth)acrylate group. One example of a suitable self-crosslinkable epoxy-functional monomer is glycidyl methacrylate (GMA). However, other crosslinkable epoxy group-containing ethylenically unsaturated monomers can also be used as comonomers in the polymerization. Acryloyl groups are another example of a suitable crosslinkable group. Like the epoxy-functional monomers, the monomer fragment of the crosslinkable acryloyl-functional monomers may comprise, for example, a styrene group or a (meth)acrylate group.

Methods of forming random copolymers from styrene monomers, methacrylate monomers and epoxy- or acryloyl-functional monomers are described in U.S. Pat. No. 8,362,179.

Hydroxy groups are an example of a suitable surface-crosslinkable group for surface materials such as inorganic oxides (e.g., $SiO_2$) or other materials having surface —OH groups. The monomer fragment of the crosslinkable hydroxy-functional monomer may comprise, for example, a styrene group or a (meth)acrylate group. One example of a suitable self-crosslinkable hydroxy-functional monomer is 2-hydroxyethyl methacrylate (HEMA). Methods of forming random copolymers from styrene monomers, methacrylate monomers and hydroxy-functional monomers are described in In et al., *Langmuir* 2006, 22, 7855-7860.

By way of illustration, the following paragraphs describe some specific examples of: (a) crosslinking agents that comprise (or crosslink to form) cleavable junctions; (b) crosslinkable monomers that comprise (or crosslink to form) cleavable junctions; and (c) surface-linkable monomers that comprise (or undergo surface-linking reactions to form) cleavable junctions, for use in the (cross)linking reaction schemes shown in FIGS. 1(A), 1(B) and 1(C), respectively.

Figure 2:
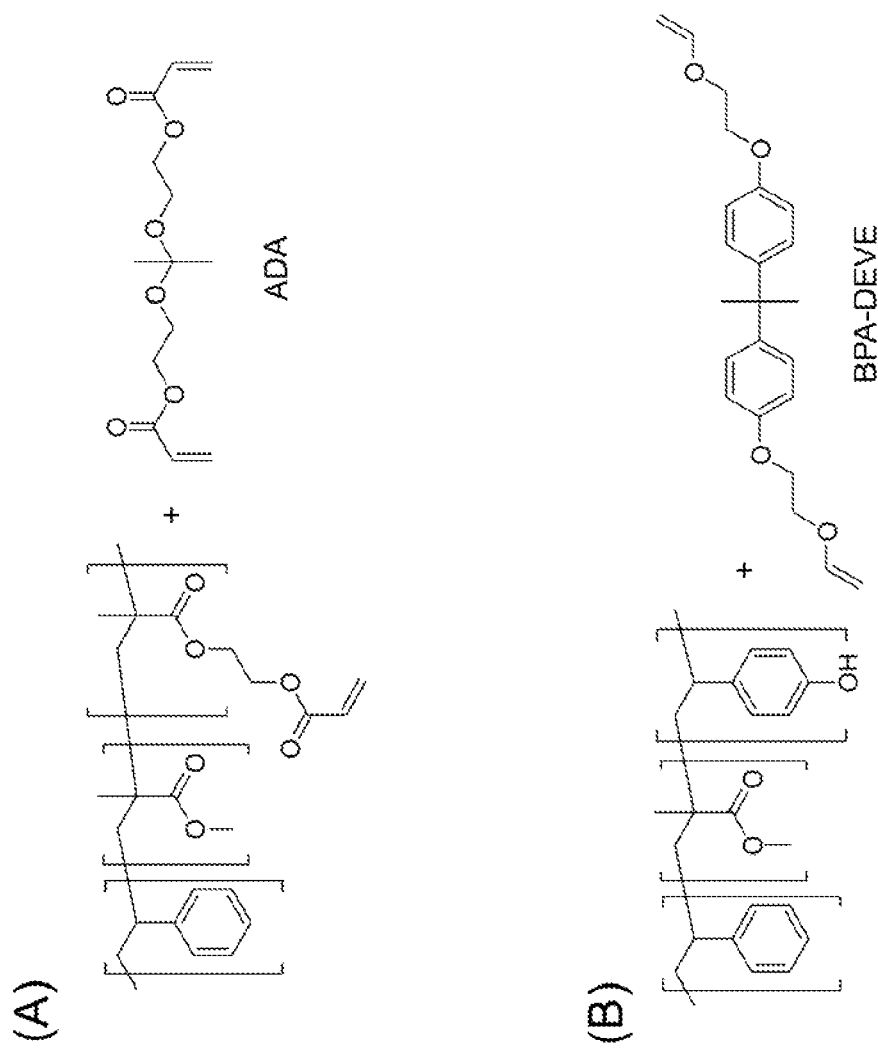
FIGS. 2(A) and (B) illustrate the use of difunctional molecular crosslinking agents to form crosslinks comprising acid-cleavable groups. The molecular crosslinking agent in FIG. 2(A) is 2,2-di(acryloyloxy-1-ethoxy)propane (ADA). The molecular crosslinking agent in FIG. 2(B) is 2,2-bis(4-[2'-(vinyloxy)ethoxy]phenyl)propane (BPA-DEVE).

Multifunctional Crosslinking Agents:

FIGS. 2(A) and (B) illustrate the use of difunctional molecular crosslinking agents to form crosslinks comprising acid-cleavable groups. The molecular crosslinking agent in FIG. 2(A) is 2,2-di(acryloyloxy-1-ethoxy)propane (ADA). Methods for synthesizing ADA crosslinkers are described in Palmieri et al., *ACS Nano*, 1, 307-312 (2007) and in Heath et al., *Macromolecules*, 41, 719-726 (2008). As indicated in FIG. 2(A), the terminal acrylate groups on ADA can undergo UV-induced crosslinking reactions via free-radical polymerization with pendant acryloyl groups on a random copolymer (illustrate here by a random copolymer of styrene, methyl methacrylate, and an acryloyl-functionalized monomer) to provide crosslinks comprising acid-cleavable acetal groups.

The molecular crosslinking agent in FIG. 2(B) is 2,2-bis (4-[2'-(vinyloxy)ethoxy]phenyl)propane (BPA-DEVE). Methods for synthesizing BPA-DEVE crosslinkers are described in Moon et al., *Polymer*, 41, 4013-4019 (2000). As indicated in FIG. 2(B), the terminal vinyloxy groups on BPA-DEVE can undergo thermally-induced crosslinking reactions with pendant hydroxyl groups on a random copolymer (illustrate here by a random copolymer of styrene, methyl methacrylate, and hydroxystyrene monomers) to provide crosslinks comprising acid-cleavable acetal groups. Acids that can be used to cleave acetal groups include acetic acid and trifluoroacetic acid.

Figure 3:
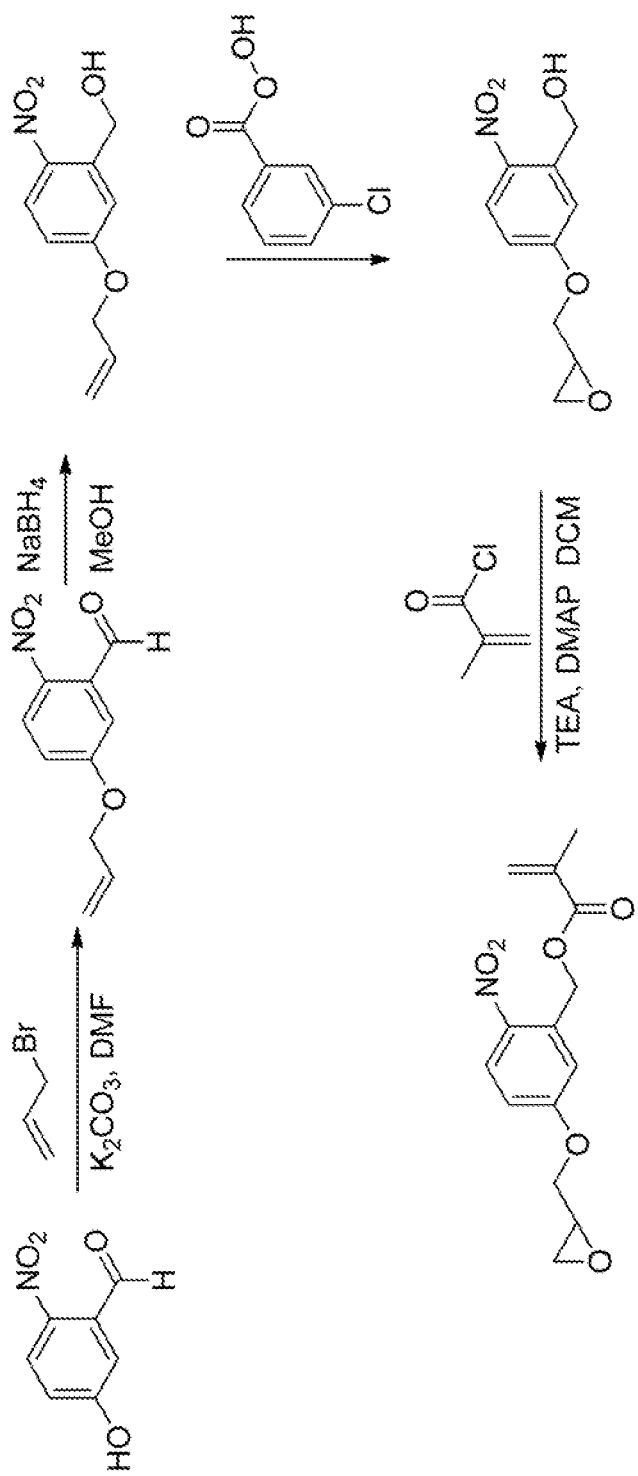
FIG. 3 shows the reaction scheme for the synthesis of a monomer comprising a crosslinkable epoxy functional group and a photocleavable 2-nitrobenzyl functional group.
Figure 4:
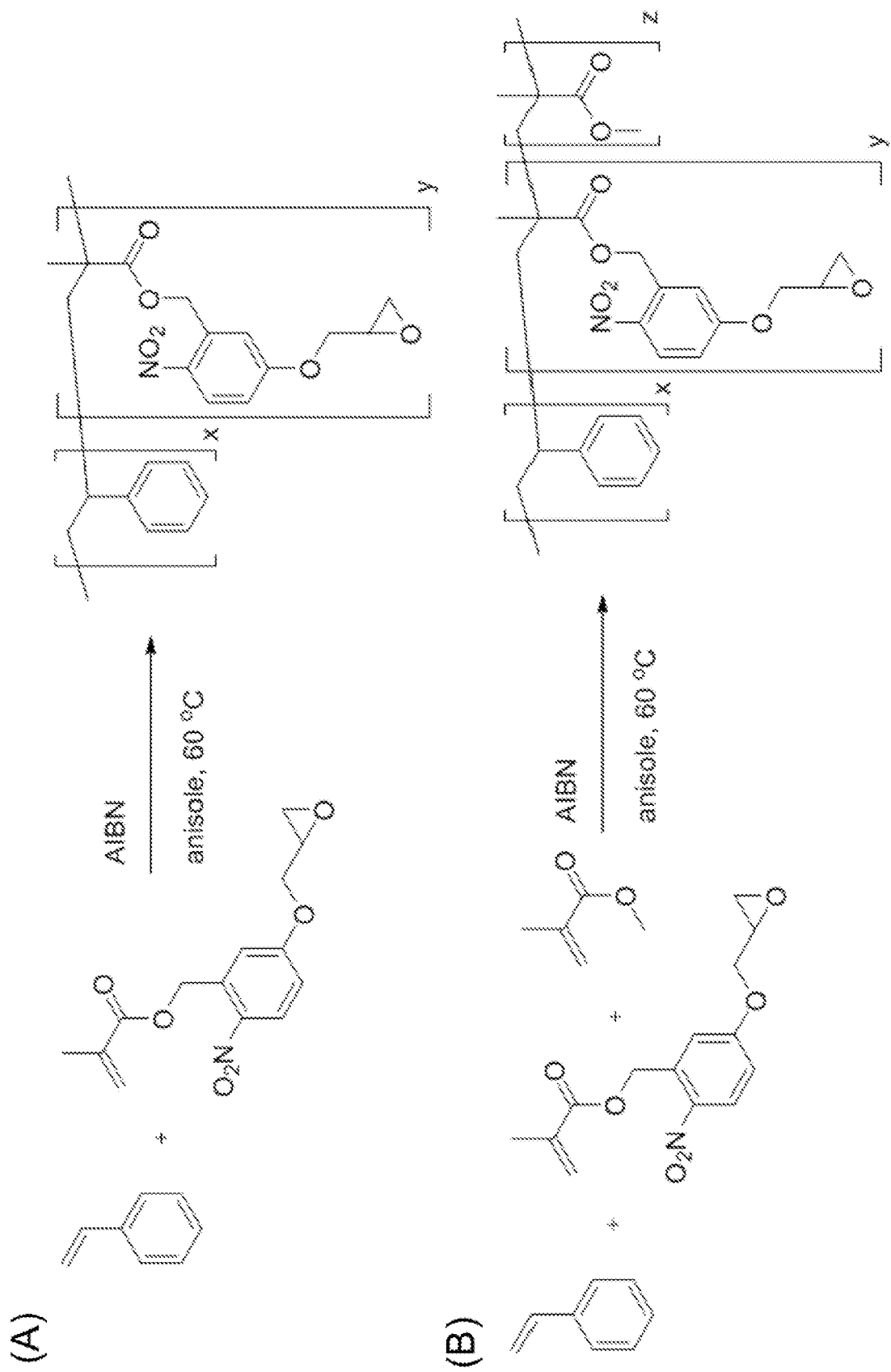
FIG. 4 shows the reaction scheme for the polymerization of the monomer of FIG. 3 with styrene monomers (A) or with styrene monomers and acrylate monomers (B)

Crosslinkable Monomers Having Cleavable-Crosslink-Forming Groups:

For random copolymers that utilize monomers having pendant groups that form readily-cleavable crosslinks, the functional group that forms the readily cleavable junctions in the crosslink and the crosslinkable functional group may be separate and distinct groups. However, in other embodiments the crosslinkable functional group is also the group that forms the readily cleavable junctions. In the former embodiments, a functional group comprising a readily cleavable junction is positioned between a crosslinkable functional group (e.g., an epoxy group) and the functional group that is polymerized into the copolymer backbone chain (e.g., a (meth)acrylate group). By way of illustration, FIG. 3 shows a synthesis scheme for a monomer that includes a terminal crosslinkable epoxy functionality and a photocleavable 2-nitrobenzyl group. FIG. 4 shows the reaction scheme for the polymerization of the monomer of FIG. 3 with styrene monomers (A) or with styrene monomers and acrylate monomers (B). A more detailed description of the synthesis of the monomer and the copolymerization is provided in the Example below.

Figure 5:
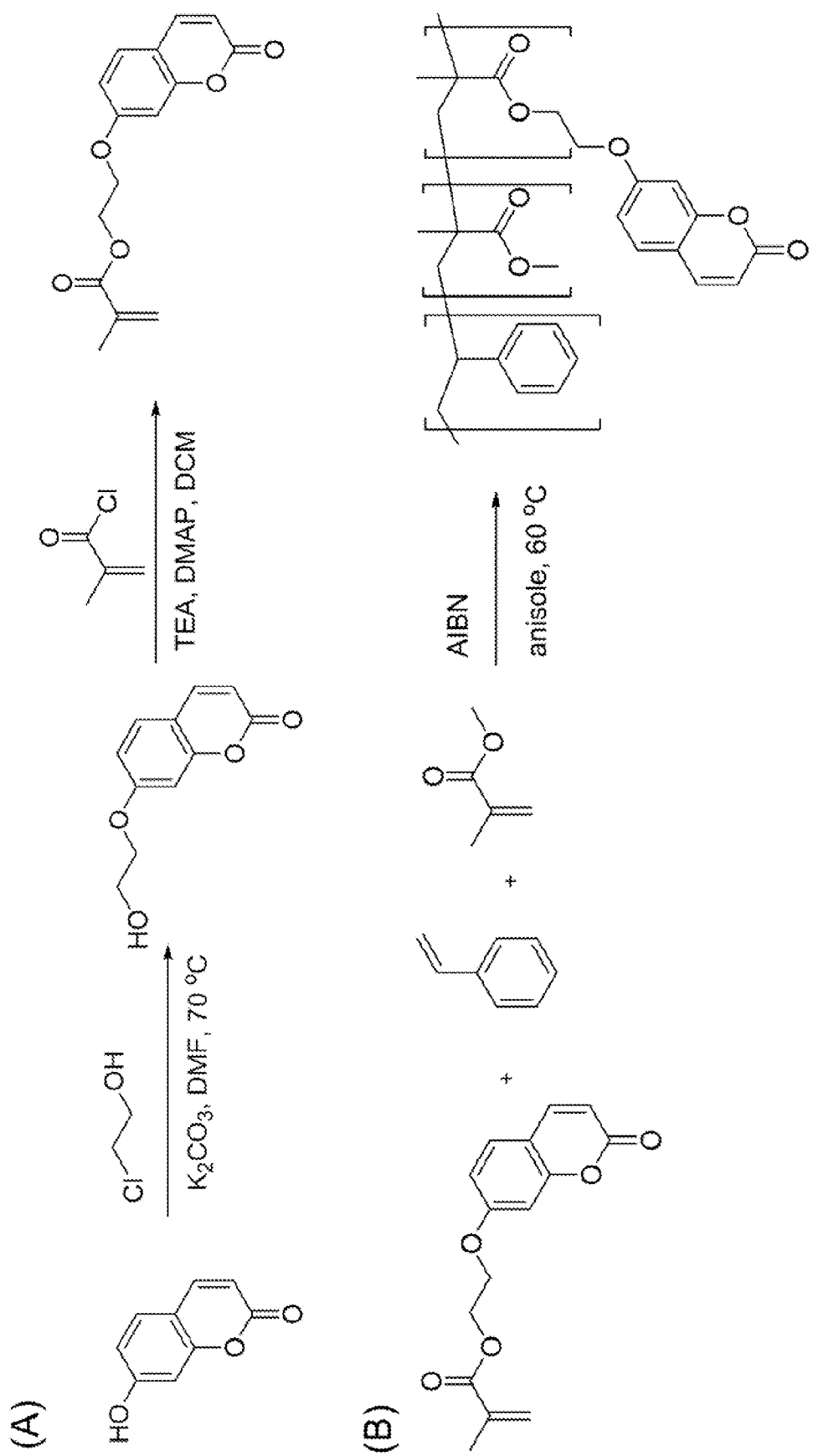
FIG. 5 shows an example of a monomer having functional group that dimerizes to form a photocleavable cyclobutane group. A reaction scheme for the synthesis of the monomer is shown in the FIG. 5(A) and a reaction scheme for the copolymerization of the monomer with styrene and methyl methacrylate is shown in FIG. 5(B). A crosslink formed by the reactions between the coumarin groups of two of the monomers is shown in FIG. 5(C).
Figure 5:
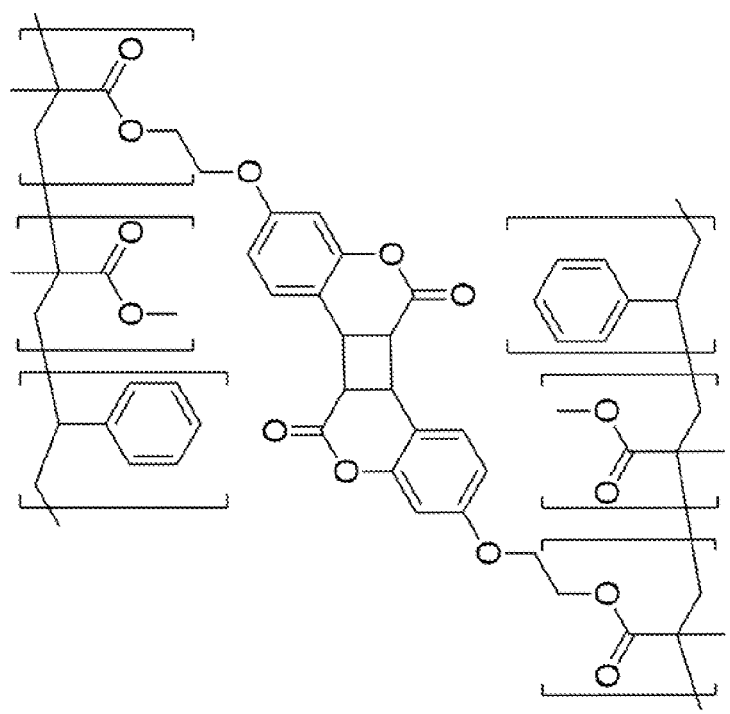
Figure 5:
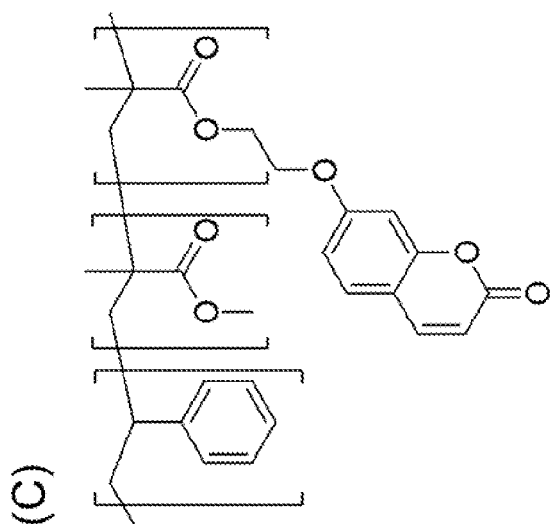

Examples of crosslinkable groups that crosslink to form a readily cleavable junction are functional groups that undergo reversible photodimerization. Examples of functional groups that undergo reversible photodimerization are those that dimerize to form photocleavable cyclobutane groups. One such monomer is shown in FIG. 5. This monomer includes a coumarin group that is capable of undergoing a photo-induced crosslinking reaction with the coumarin group on another random copolymer chain to form a crosslink comprising a photocleavable cyclobutane group. (A description of the photodimerization of the coumarin group can be found in *Macromol. Chem. Phys.*, 2004, 205, 715-723.) A reaction scheme for the synthesis of the monomer is shown in the FIG. 5(A) and a reaction scheme for the copolymerization of the monomer with styrene and methyl methacrylate is shown in FIG. 5(B). A crosslink formed by the reactions between the coumarin groups of two of the monomers is shown in FIG. 5(C). In this system, photocrosslinking can be induced by radiation of a first wavelength range (i.e., >300 nm), while cleavage (uncrosslinking) can be induced by radiation of a second wavelength range (i.e., <300 nm).

Figure 7:
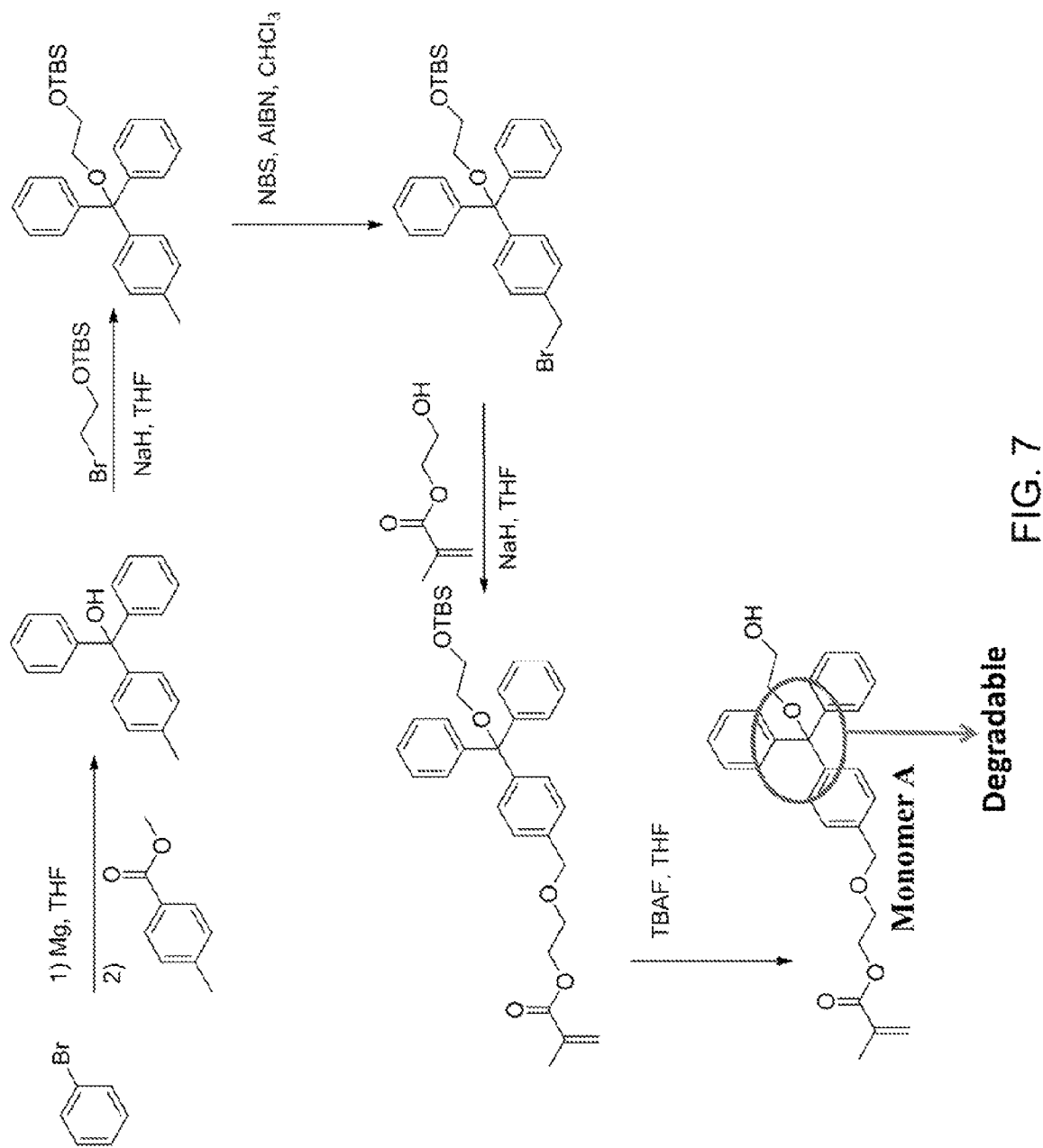
FIG. 7 shows a reaction scheme for a monomer comprising a terminal surface-linkable hydroxyl group and triphenylmethyl(trityl) ether group.
Figure 8:
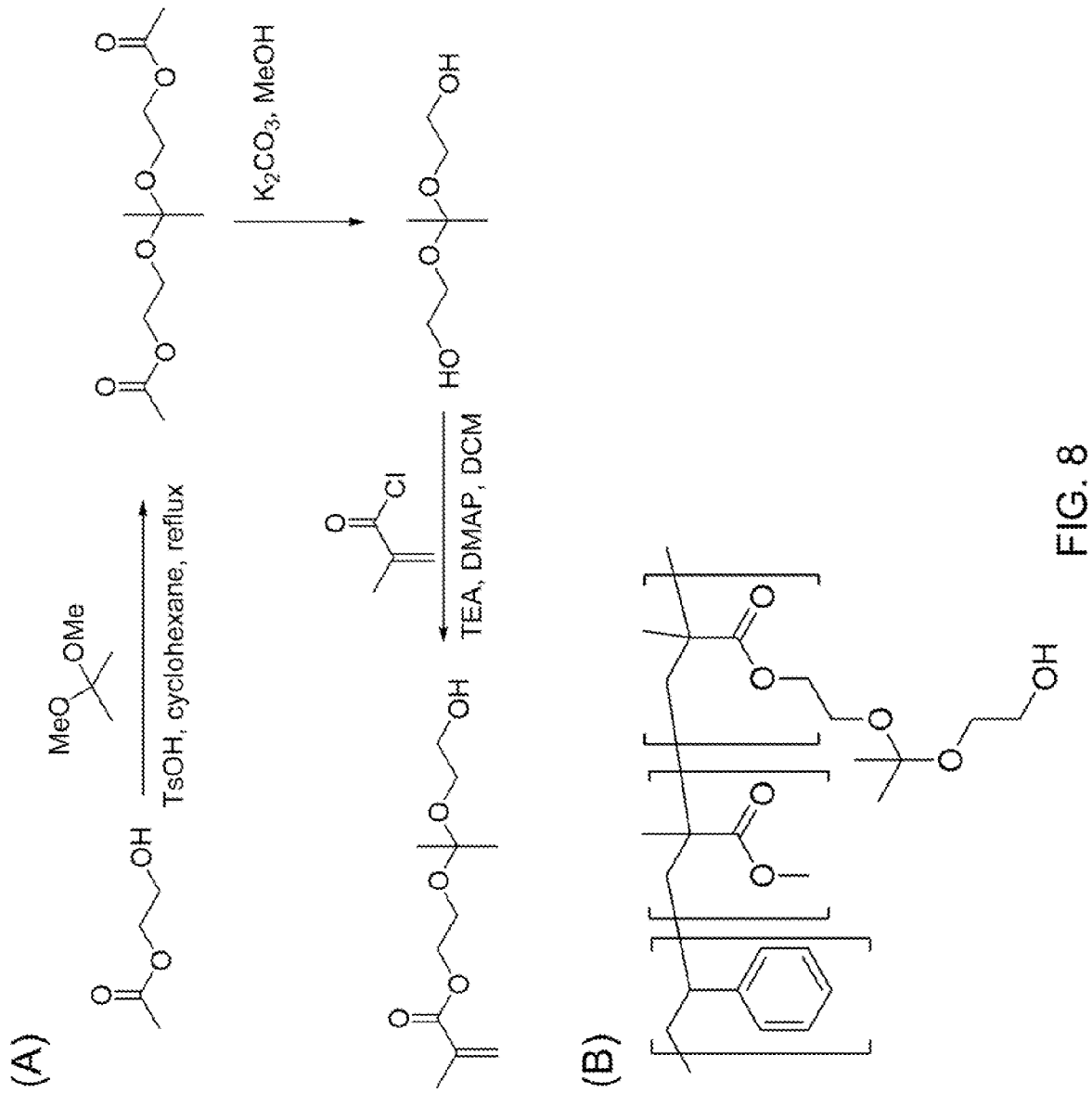
FIG. 8 shows another example of a monomer that forms readily-cleavable surface links. A reaction scheme for the synthesis of the monomer is shown in FIG. 8(A) and a random copolymer comprising the monomer copolymerized with styrene and methyl methacrylate is shown in FIG. 8(B).

Surface-Linkable Monomers Having Cleavable-Surface Link-Forming Groups:

For random copolymers that utilize monomers having pendant groups that form readily-cleavable surface links, the functional group that forms the readily cleavable junctions in the surface link and the surface linkable functional group may be separate and distinct groups. However, in other embodiments the surface linkable functional group is also the group that forms the readily cleavable junction. FIG. 7 shows a reaction scheme for a monomer comprising a terminal surface-linkable hydroxyl group and triphenylmethyl(trityl) ether group. The monomer can be copolymerized into a random copolymer via its methacrylate group. The surface linkages that graft the copolymer chains to the substrate surface can be cleaved at the trityl junction using mild acid. Another example of a monomer that forms readily-cleavable surface links is shown in FIG. 8. A reaction scheme for the synthesis of the monomer is shown in FIG. 8(A) and a random copolymer comprising the monomer copolymerized with styrene and methyl methacrylate is shown in FIG. 8(B). The monomer comprises a terminal surface-linkable hydroxyl group connected to a mild acid-cleavable acetal group.

Figure 6:
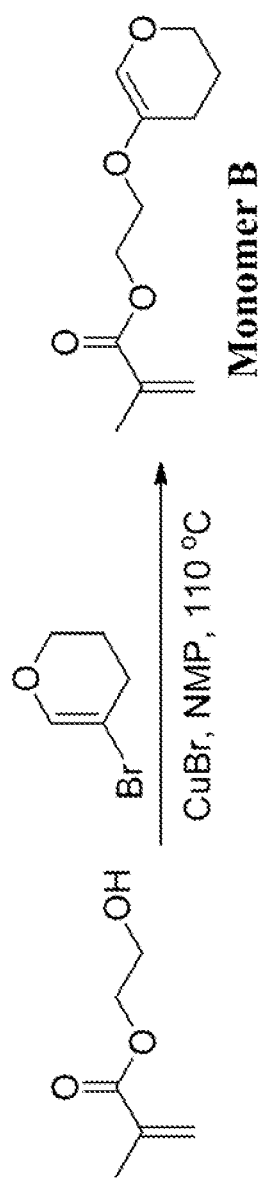
FIG. 6 shows a dihydropyran (DHP) group-containing monomer having a crosslinkable functional group that forms a crosslink having a readily cleavable junction.

Another example of a monomer having a surface-linkable functional group that forms a surface-link having a readily cleavable junction is shown in FIG. 6. This monomer includes a dihydropyran (DHP) group. DHP is a vinyl ether that undergoes dimerization to form a crosslink comprising an acid-cleavable acetal. Dihydropyran is sufficiently reactive to graft with a surface without other catalysts. Surface-hydroxyl groups (such as those provided by silanols) either react with either end of the double bond to form an acetal linkage.

The optimal ratios of the various monomers in the random copolymers will depend on the intended application for the random copolymer films. For films intended for use as surface-modifying layers in BCP lithography, enough of the (cross)linkable comonomer should be included to render the (cross)linked film stable against delamination from the underlying substrate. Typically, this can be accomplished with a low (cross)linkable monomer content. For example, the (cross)linkable monomer content can be less than about 10%. This includes embodiments of the random copolymers having a (cross)linkable monomer content of no greater than about 6% (e.g., from about 1% to about 5%).

The monomer content of the random copolymer can be selected to provide the desired wetting behavior in an overlying block copolymer film and, as such, the optimal ratios of the monomers will depend on the monomer content of the block copolymer and on the desired domain morphology. For example, the ratio of monomers in the random copolymers can be selected such that the random copolymer film provides a preferential surface—that is, a surface that is preferentially wet by one of the polymer blocks in an overlying block copolymer. As a result, the block copolymer self-assembles, via phase-segregation, into domains that are oriented parallel (horizontal) with respect to the surface of the random copolymer film. Examples of domains having a parallel orientation include parallel lamellar domains and parallel cylindrical domains. Spherical domains may also be formed in a block copolymer overlying a preferential surface modifying layer. Alternatively, the ratio of monomers in the random copolymers can be selected such that the random copolymer film provides a neutral surface. As used herein, the term neutral surface (or neutral layer) refers to a surface (or layer) that does not exhibit preferential wetting behavior—or that exhibits only a very weak preferential wetting behavior—toward a polymer block in the block copolymer, such that it provides for the induction of perpendicular (vertical) domain formation in the block copolymer. Examples of domains having a perpendicular orientation include perpendicular lamellar domains and perpendicular cylindrical domains.

For applications in BCP lithography, the vinyl monomer (e.g., styrenic monomers) content in a vinyl monomer-containing surface modifying random copolymer film will generally be in the range from about 5% to about 90%. This includes embodiments in which the vinyl monomer content is in the range from about 40% to about 80% and further includes embodiments in which the vinyl monomer content is in the range from about 50% to about 70%.

Once the random copolymer films have been formed, a layer of domain-forming block copolymer can be deposited over the film using a coating technique such as spin-coating. The block copolymer can then be subjected to conditions that induce the formation of a pattern of domains in the block copolymer film via phase separation. The step of subjecting the block copolymer to conditions that induce it to undergo domain formation include subjecting the block copolymer to a thermal anneal for a time sufficient to allow the block copolymer to self-assemble into domains or subjecting the block copolymer to a solvent anneal. During a solvent anneal, the block copolymer film undergoes swelling as it is exposed to a saturated solvent vapor atmosphere, typically at room temperature (23° C.), for a time sufficient to allow the block copolymer to self-assemble into domains.

The self-assembled block copolymers can be used to transfer patterns comprising dense arrays of dots or dense arrays of lines and spaces into or onto (collectively "to") an underlying substrate. The former can be generated from sphere-forming block copolymers or from cylinder-forming block copolymers with domains oriented perpendicular (vertical) with respect to the substrate surface, and the latter from cylinder-forming block copolymers with domains oriented parallel with respect to the substrate surface or lamella-forming block copolymers with domains oriented vertically with respect to the substrate surface. However, lamellae and cylinders that are oriented perpendicular (vertical) with respect to the underlying substrate surface may have advantages in pattern transfer applications over spheres or parallel cylinders because of the higher aspect ratio of the resulting template and the vertical side-walls.

Figure 9:
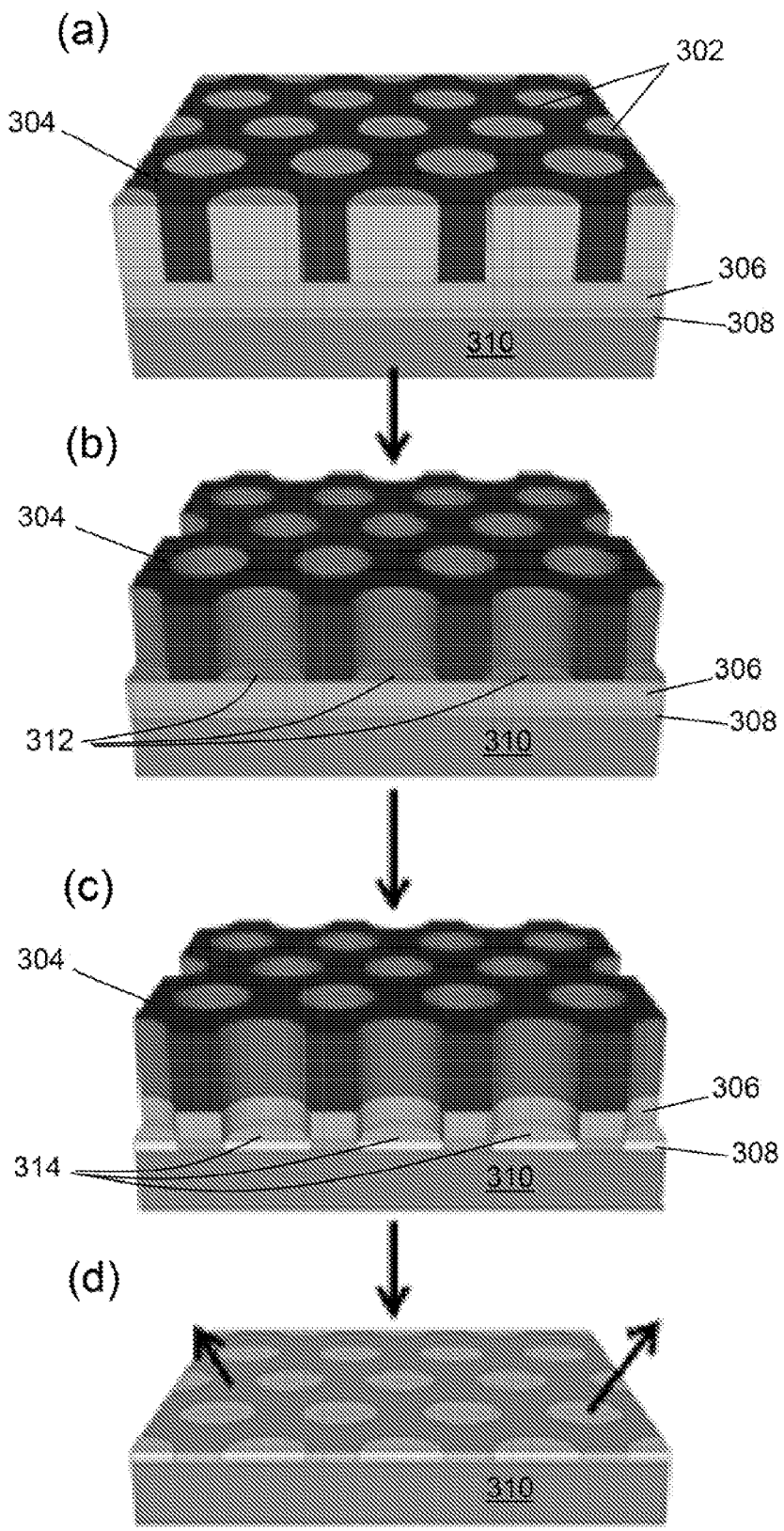
FIG. 9 is a schematic diagram of a method for transferring a pattern defined in a domain-forming block copolymer film to an underlying substrate.

The basic steps of transferring a pattern defined by a self-assembled block copolymer layer into on underlying substrate are shown in FIG. 9. In the embodiment shown here, the initial structure (panel (a)) comprises a block copolymer that forms and array of vertically oriented, hexagonally-packed cylindrical domains 302 embedded in a matrix domain 304. This domain morphology can be achieved using, for example, a neutral layer 306 comprising a random copolymer of styrene and methyl methacrylate monomers and a block copolymer of styrene and methyl methacrylate, P(S-b-MMA), wherein the number average molecular weight of the polystyrene in the P(S-h-MMA) is in the range from about 20,000 to 55,000 and the number average molecular weight of the polymethyl methacrylate ranges from about 8,000 to 25,000. Neutral layer 306 overlies a thin substrate 308, such as monolayer graphene. The structure further includes an underlying support substrate 310.

In order to convert the layer of self-assembled block copolymer into a mask for pattern transfer applications, one or more domains are selectively removed from the block copolymer (panel (b)). Selective removal of the polymeric domains can be carried out using an etchant that is selective for the polymer block to be removed. Suitable etchants include wet chemical etchants and plasma etchants. For some materials, photo-etching can be used. However, if a harsh wet chemical or plasma etchant, such as an oxygen plasma, is employed, the etching should be stopped before the underlying random copolymer film is removed in order to protect the underlying substrate from etchant-induced damage. For this reason, it is advantageous to use a block copolymer comprising domains that can be selectively removed by photo-etching. PMMA domains are an example of a polymeric domain that can be removed by exposure to UV light.

Figure 10:
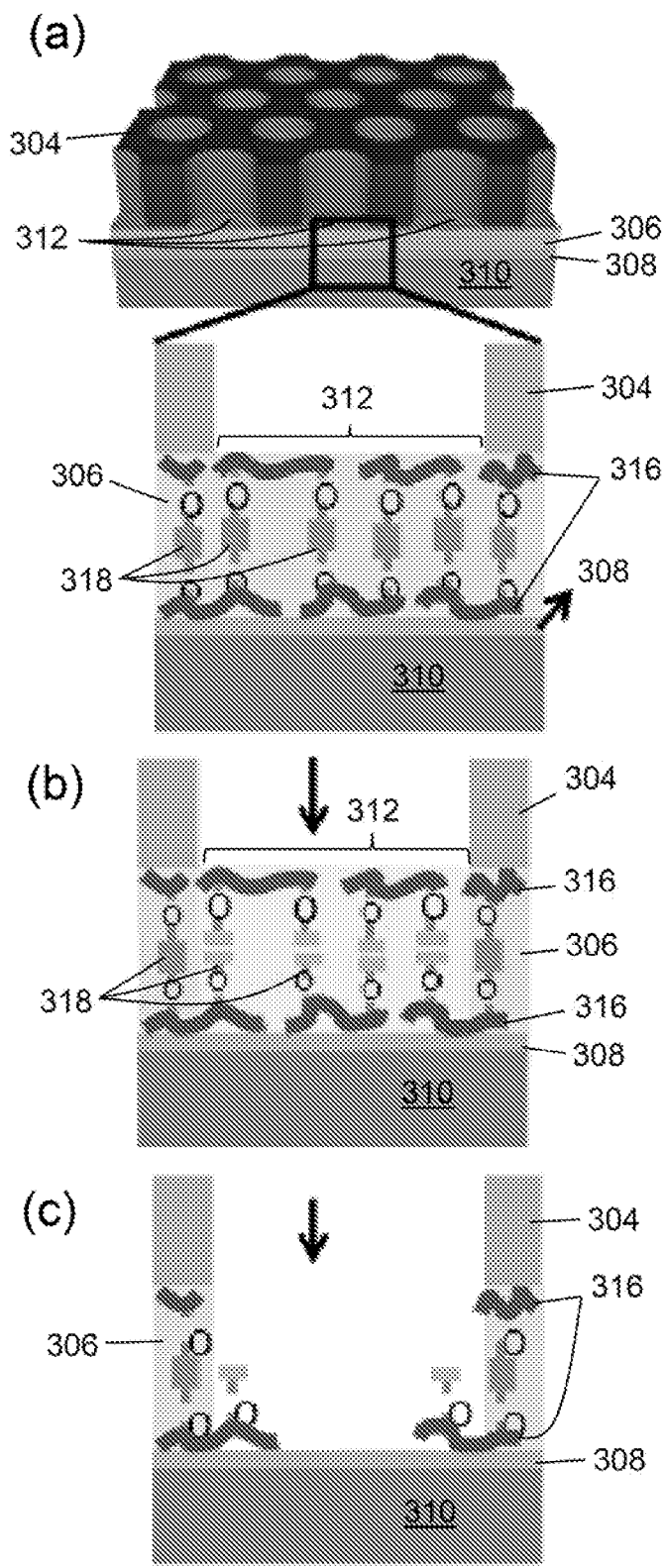
FIG. 10 is a schematic diagram showing the process of degrading the crosslinked copolymer film of a neutral layer in a block copolymer lithography application.

Next the newly exposed portions 312 of the random copolymer film are selectively removed to expose portions 314 of substrate 308 (panel (c)). The initial step in removing neutral layer 306 is the cleavage of the crosslinks between the random copolymer chains (or the cleavage of the molecular links between the random copolymer chains and the surface of substrate 308) in order to destabilize the film. This process is illustrated schematically for a crosslinked random copolymer film in FIG. 10. Panel (a) of FIG. 10 shows an enlarged view of an exposed portion 312 of neutral layer 306. Neutral layer 306 comprises a crosslinked random copolymer film comprising random copolymer chains 316 crosslinked via crosslinks 318 comprising junctions that are cleavable under mild conditions. Upon exposure of the exposed portion 312 to radiation or a mild acid solution, the crosslinks are broken and the random copolymer film destabilized (panel (b)). Once destabilized, the random copolymer film can be removed by washing in a suitable washing solution or dissolved in a suitable solvent (panel (c)).

Finally, the pattern defined by exposed portions 314 can be transferred to (i.e., into or onto) the substrate. For example, in the embodiment depicted in panels (c) and (d) of FIG. 9, exposed portions 314 can be selectively chemically modified by chemical functionalization. This can be accomplished, for example, by the chemisorption or phyisorption of atoms or molecules onto the exposed areas of the substrate. This may be done to selectively modify the bonding pattern of the substrate in the exposed regions and/or to selectively modify the electronic or magnetic properties of the substrate in the exposed regions. For example, if the substrate is monolayered or multilayered graphene, the exposed portions can be selectively hydrogenated to alter the bandgap of the graphene substrate in those portions. Alternatively, the exposed regions can be selectively halogenated (e.g., fluorinated) in order to tune the electronic transport properties of the graphene substrate in those portions.

Figure 11:
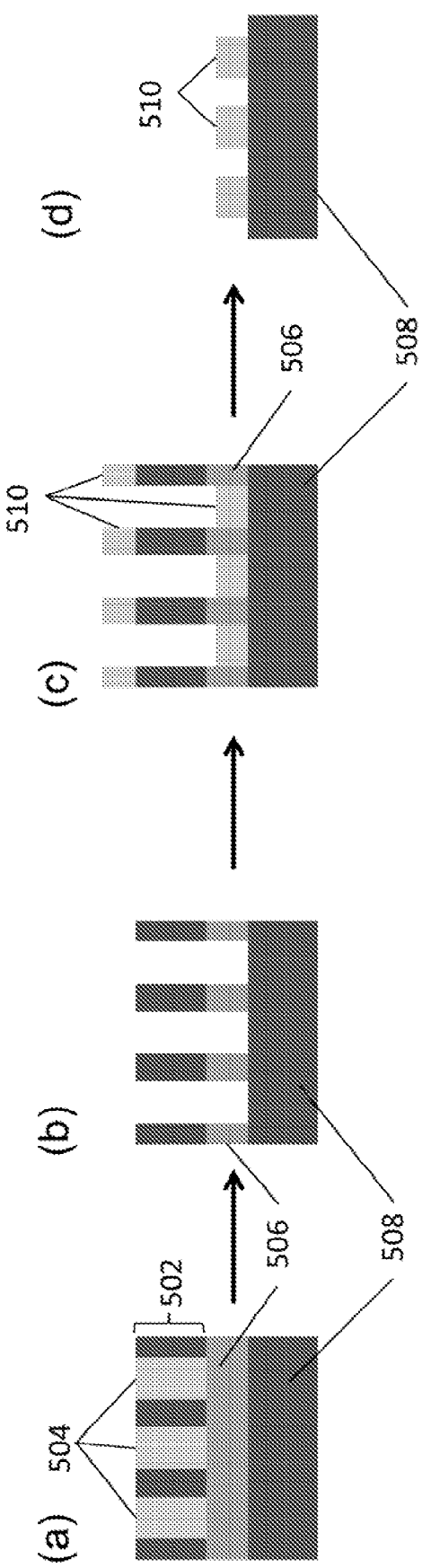
FIG. 11 is a schematic diagram of a method of transferring a pattern defined in a domain-forming block copolymer film onto the surface of an underlying substrate.

Another means by which the pattern defined by exposed portions 314 can be transferred to the substrate is by selectively forming a coating of another material (e.g., by depositing or growing said material) on the exposed portions. This pattern transfer process is illustrated schematically in FIG. 11. Again, the process begins with a layer of self-assembled block copolymer 502 having vertically oriented polymeric domains 504 overlying a random copolymer film 506 that acts as a neutral layer. The substrate to be patterned 508 is disposed beneath copolymer film 506 (panel (a)). A set of the polymeric domains as well as the underlying portion of random copolymer film 506 are selectively removed to form a pattern-defining mask structure over substrate 508 (panel (b)). Next, a coating of another material 510 is deposited over the mask structure and onto the exposed portions of substrate 508 (panel (c)). Upon removal (lift-off) of the mask structure (panel (d)), a pattern of deposited material 510 corresponding to the mask structure pattern, remains on the substrate surface (panel (c)).

The nature of the coating material can vary, depending on the intended application. The coating material may be chemically inert or chemically reactive; may be an inorganic material (comprising, for example, a metal, metal oxide, ceramic or glass) or organic (e.g., a polymer); or may be magnetic, electrically conducting, electrically insulating or semiconducting.

Yet another means by which the pattern defined by exposed portions 314 can be transferred to the substrate is by selectively removing the exposed portions from the substrate to form holes or indentations in the shape of the openings defined by the mask structure. For example, if the substrate is monolayered or multilayered graphene, an array of holes can be transferred into the graphene to provide nanoperforated graphene. Alternatively, an array of stripes could be patterned in the graphene to form a graphene nanoribbon array. Notably, because the domains in the block copolymer can be formed with nanoscale dimensions (e.g., with dimensions, such as cylinder diameters or lamellae thicknesses, of ≤1000 nm, ≤100 nm or ≤10 nm) the features in the patterned substrate can have correspondingly small dimensions (e.g., hole diameters, stripe widths, pillar diameters).

Once the pattern defined by exposed portions 314 has been transferred to the underlying substrate, the remainder of the random copolymer film and the block copolymer layer can be removed (FIG. 9, panel (d)). Here, again, in order to avoid damage to the underlying substrate caused by harsh etchants, the random copolymer film is removed by cleaving the crosslinks between the random copolymer chains (or cleaving the links between the random copolymer chains and the surface of substrate) in order to destabilize the film and then washing away or dissolving the destabilized film.

Example

This example illustrates a method of forming a crosslinked random copolymer film comprising crosslinks with UV-cleavable 2-nitrobenzyl groups and the use of the crosslinked random copolymer film as a neutral layer for vertical domain-forming block copolymers.

UP-Cleavable, Crosslinkable Monomer Synthesis:

The crosslinkable monomer in this example was a methacrylate monomer comprising a terminal thermally crosslinkable epoxy groups and a UV-cleavable 2-nitrobenzyl group between the methacrylate functionality and the epoxy functionality. The scheme for synthesizing the monomer is summarized in FIG. 2.

Materials. All chemicals were purchased from Sigma-Aldrich and used without further purification unless otherwise noted. 2,2'-azobis(2-methylpropionitrile) (AIBN) was recrystallized from acetone and dried under vacuum. Styrene, glycidyl methacrylate (GMA) and methyl methacrylate (MMA) were distilled from calcium hydride under reduced pressure.

5-allyloxy-2-nitrobenzaldehyde. 5-hydroxybenzaldehyde (10.03 g, 60 mmol), allyl bromide (8.71 g, 72 mmol), and potassium carbonate (12.44 g, 90 mmol) were added to 70 mL of dimethylformamide and stirred vigorously overnight at room temperature. The resultant mixture was poured into water and extracted with dichloromethane twice. The organic layer was then washed with sat. sodium carbonate twice and water eight times to remove residual DMF. After drying with sodium sulfate, rotary evaporation was used to remove dichloromethane. The resulting viscous oil was used in the next step without further purification.

5-allyloxy-2-nitrobenzyl alcohol. 5-allyloxy-2-nitrobenazldehyde (11.4 g, 55 mmol) was dissolved in 150 mL of methanol. Sodium borohydride (3.1 g, 82.5 mmol) was added slowly to the solution with the temperature kept below reflux. After completing the addition of borohydride, the reaction was stirred for 15 minutes and then the solvent was removed by rotary evaporation. Water was added to hydrolyze the boronic ester and the product was extracted with dichloromethane. The organic layer was washed with water three times, dried over sodium sulfate and then the solvent was removed by rotary evaporation. The resulting solid was used in the next step without further purification.

5-glycidyloxy-2-nitrobenzyl alcohol. 5-allyloxy-2-nitrobenzyl alcohol (7.3 g, 35 mmol) and m-chloroperoxybenzoic acid (77 wt. %, 9.4 g, 42 mmol) were dissolved in dichloromethane and refluxed until the allyl peaks disappeared from the 1H-NMR spectrum (approximately 48 hours). The reaction was then washed with aqueous sodium carbonate twice, water three times and then dried over sodium sulfate. The solvent was partially removed by rotary evaporation and then poured into hexanes to precipitate the product. The resulting solid was collected by suction filtration and was used in the next step without further purification.

5-glycidyloxy-2-nitrobenzyl methacrylate (PCM). 5-glycidyloxy-2-nitrobenzyl alcohol (6.0 g, 26.6 mmol) was added to a solution of triethylamine (4.05 g, 40 mmol) and 4-dimethylaminopyridine (0.16 g, 1.3 mmol) in 100 mL dichloromethane at 0° C. Metbacryloyl chloride (3.65 g, 35 mmol) was added slowly by syringe. The reaction was stirred at 0° C. until TLC showed complete conversion (approximately 30 minutes). The reaction was quenched by the addition of water and the layers were separated. The organic layer was washed with aqueous sodium carbonate twice, 0.1 M HCl once and water twice. The organic layer was then dried over sodium sulfate and the solvent removed by rotary evaporation. The resulting solid was purified by column chromatography using hexanes and ethyl acetate as eluent.

Synthesis of random copolymers. All polymerizations used 10 mmol of monomer in total with variations in the feed ratio to achieve different compositions. In general, styrene, MMA and PCM were dissolved in 2 grams of anisole and 4.1 mg of AIBN was added. The flask was then degassed by three freeze-pump-thaw cycles and polymerized at 60° C. for 16 hours. After 16 hours, the flask was cooled to room temperature and the reaction opened to air. The viscous liquid was diluted with THF and precipitated into hexanes. The resulting solid was collected by gravity filtration and dried under vacuum.

Substrate preparation and thin film formation. A solution of P(S-r-MMA-r-PCM) or P(S-r-PCM) (0.3% w/w) in toluene was spin-coated onto silicon wafers that had been cleaned using piranha acid (7:3 $H_2SO_4$:$H_2O_2$, caution: reacts violently with organic compounds). The substrate was then annealed under vacuum at 220° C. for 5 min. After annealing, the substrate was soaked in toluene and rinsed copiously with fresh toluene to remove uncross-linked polymer, resulting in 5~11 nm thick cross-linked thin film. On these cross-linked mats, a solution of cylinder forming P(S-b-MMA) (Mn(PS) ~46 k. Mn(PMMA)~21 k) in toluene (1.0 wt %) or a solution of lamellar forming P(S-b-MMA) (Mn(PS)~52 k, Mn(PMMA)~52 k) in toluene (1.5 wt %) was spin-coated at 4000 rpm to produce films with BCP thicknesses of 25 nm or 37 nm. All BCP films were annealed at 220° C. for 10 min under vacuum to drive self-assembly of block copolymer domains.

Evaluation of photocleavability. Thin films of the cross-linked mat (P(S-r-MMA-r-PCM) or P(S-r-PCM)) as prepared previously were exposed to 305 nm light for various times and then soaked in THF before being dried in a stream of air. The thickness was evaluated using ellipsometry.

The results are summarized in Table 1.

TABLE 1

UV Light Time vs. PC5 Neutral Layer Thickness

| UV Light Time (min) | Thickness (nm) |
|---|---|
| 0 | 6.93 |
| 5 | 4.71 |
| 10 | 4.99 |
| 15 | 4.45 |
| 20 | 4.47 |
| 30 | 4.47 |
| 40 | 3.86 |

Figure 12:
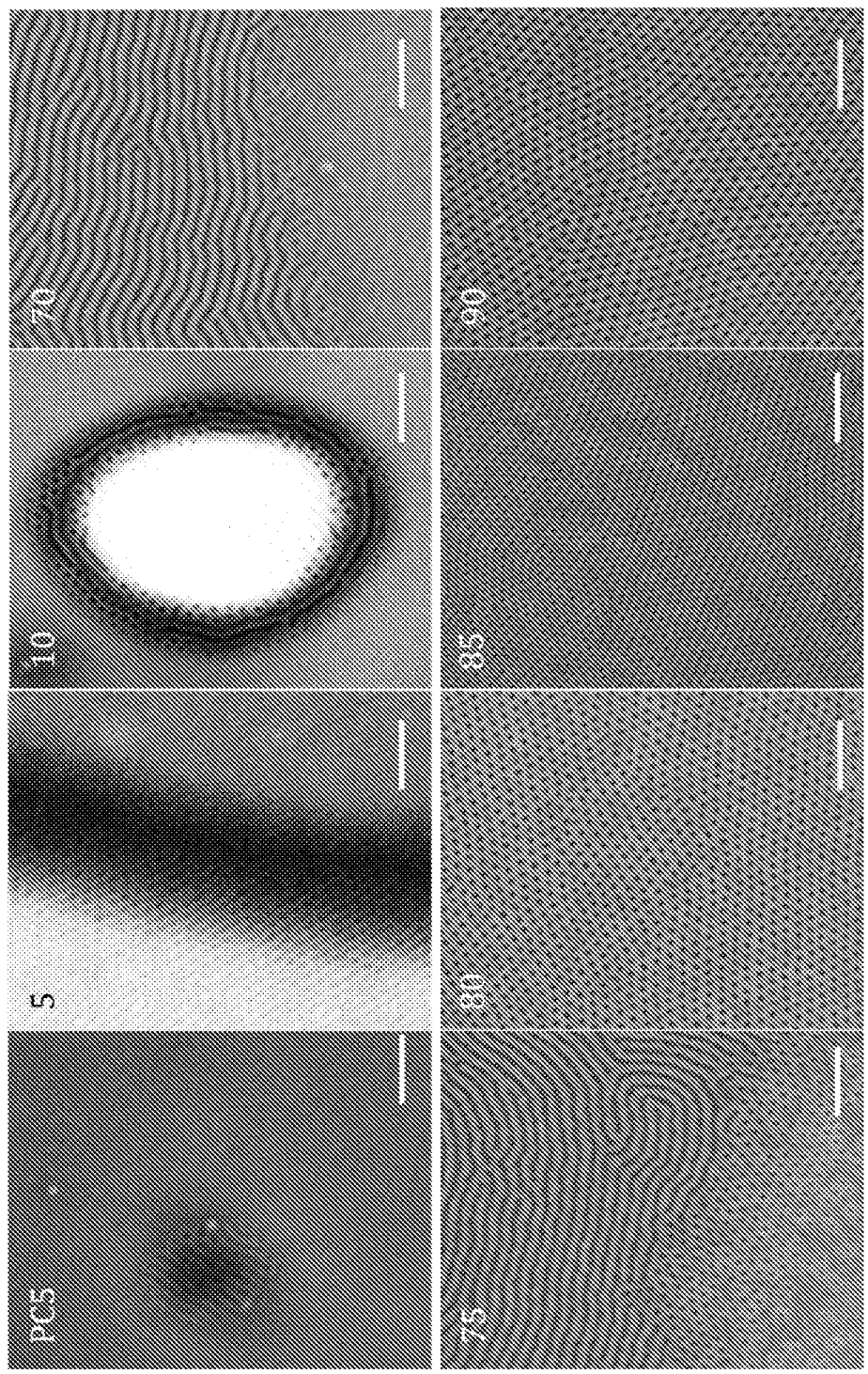
FIG. 12 shows scanning electron microscopy (SEM) images of vertical cylinder domain-forming PS-b-PMMA block copolymers on neutral layers comprising random copolymers of styrene and methyl methacrylate with different styrene monomer contents.
Figure 13:
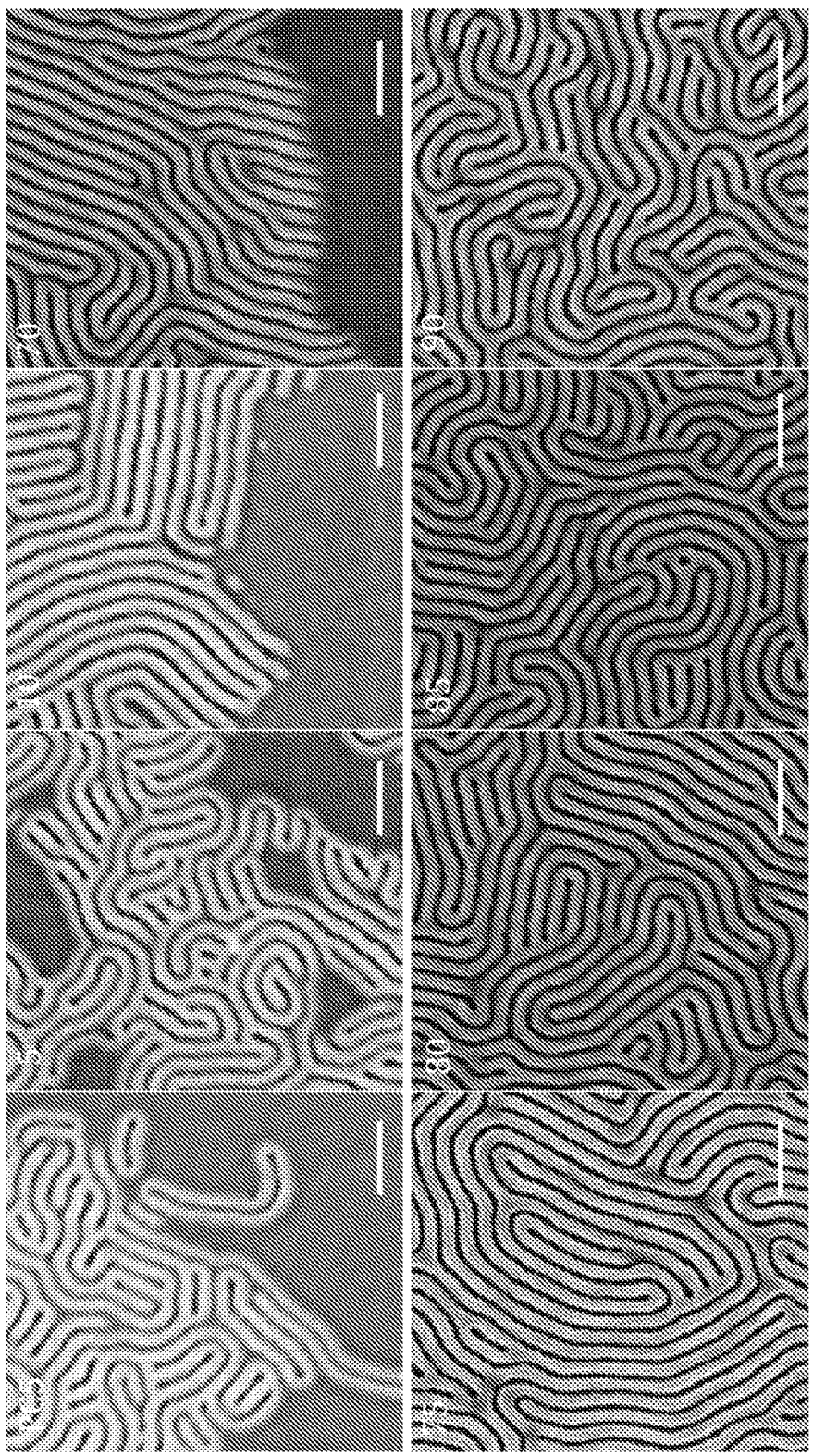
FIG. 13 shows scanning electron microscopy (SEM) images of vertical lamellae domain-forming PS-b-PMMA block copolymers on neutral layers comprising random copolymers of styrene and methyl methacrylate with different styrene monomer contents.

Block Copolymer Layer Formation:

To investigate the neutral window of the crosslinked neutral layer. PS-b-PMMA block copolymers were deposited onto the neutral layers having styrene contents ranging from 5% to 90%. Both a vertical cylinder-forming block copolymer (Mn(styrene)=46,000; Mn(PMMA)=21,000) and a vertical lamellae-forming block copolymer (Mn(styrene)= 52.000; Mn(PMMA)=52,000) were studied. The resulting structures are shown in the SEM images of FIGS. 12 and 13.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a self-assembled block copolymer film, the method comprising:
   forming a crosslinked copolymer film on a substrate surface, the crosslinked copolymer film comprising crosslinked random copolymer chains, wherein the crosslinks comprise photocleavable junctions or mild acid-cleavable junctions;
   depositing a domain-forming block copolymer over the crosslinked copolymer film; and
   subjecting the domain-forming block copolymer to conditions that induce the block copolymer to self-assemble into a pattern of block copolymer domains.

2. The method of claim 1, wherein the crosslinked copolymer film provides a neutral layer, such that the block copolymer domains are vertically oriented.

3. The method of claim 2, further comprising selectively removing one or more of the block copolymer domains and the portions of the crosslinked copolymer film underlying said domains, such that a mask pattern is formed over the substrate.

4. The method of claim 3, further comprising transferring the mask pattern to the substrate.

5. The method of claim 3, wherein the crosslinks comprise the photocleavable junctions and further wherein the step of selectively removing the portions of the crosslinked copolymer film underlying said domains comprises exposing said portions to radiation having wavelengths that cleave the photocleavable junctions in the crosslinks, such that the random copolymer chains are uncrosslinked, and removing the uncrosslinked random copolymer chains from the substrate surface.

6. The method of claim 5, wherein the photocleavable junctions are UV-cleavable.

7. The method of claim 6, wherein the photocleavable junctions are provided by 2-nitrobenyl groups.

8. The method of claim 6, wherein the photocleavable junctions are reversibly photocrosslinkable junctions.

9. The method of claim 8, wherein the reversibly photocrosslinkable junctions are provided by reversibly photodimerizable coumarin groups.

10. The method of claim 3, wherein the step of selectively removing the portions of the crosslinked copolymer film underlying said domains comprises exposing said portions to a mild acid that cleaves mild acid-cleavable junctions in the crosslinks, such that the random copolymer chains are uncrosslinked, and removing the uncrosslinked random copolymer chains from the substrate surface.

11. The method of claim 10, wherein the mild acid-cleavable junctions are provided by acetal groups.

12. The method of claim 1, wherein forming the crosslinked copolymer film on the substrate surface comprises:
   depositing a coating comprising the random copolymer chains onto a substrate surface, wherein the random copolymer chains comprise comonomers comprising crosslinkable functional groups; and
   subjecting the coating to conditions that induce crosslinking reactions between the crosslinkable functional groups to form the crosslinks.

13. The method of claim 12, wherein the photocleavable or mild acid-cleavable junctions are formed by the crosslinking reactions.

14. The method of claim 12, wherein the comonomers comprising the crosslinkable functional groups further comprise the photocleavable or mild acid-cleavable junctions.

15. The method of claim 12, wherein forming the crosslinked copolymer film on the substrate surface comprises:
   depositing a coating comprising a crosslinking agent and the random copolymer chains onto a substrate surface, wherein the random copolymer chains comprise comonomers comprising crosslinkable functional groups; and
   subjecting the coating to conditions that induce crosslinking reactions between the crosslinking agent and the crosslinkable functional groups to form the crosslinks.

16. A method of forming a self-assembled block copolymer film, the method comprising:
   forming a copolymer film on a substrate surface, the copolymer film comprising random copolymer chains, wherein the random copolymer chains are bonded to the surface at multiple points by surface links and further wherein the surface links comprise photocleavable junctions or mild acid-cleavable junctions;
   depositing a domain-forming block copolymer over the surface-linked copolymer film; and
   subjecting the domain-forming block copolymer to conditions that induce the block copolymer to self-assemble into a pattern of block copolymer domains.

17. The method of claim 16, wherein the surface-linked copolymer film provides a neutral layer, such that the block copolymer domains are vertically oriented.

18. The method of claim 17, further comprising selectively removing one or more of the block copolymer domains and the portions of the surface-linked copolymer film underlying said domains, such that a mask pattern is formed over the substrate.

19. The method of claim 16, wherein the crosslinks comprise the mild acid-cleavable junctions and further wherein the step of selectively removing the portions of the surface-linked copolymer film underlying said domains comprises exposing said portions to a mild acid that cleaves the mild acid-cleavable junctions in the surface links, such that the random copolymer chains are unlinked from the substrate surface, and removing the unlinked random copolymer chains from the substrate surface.

20. The method of claim 19, wherein the mild acid-cleavable junctions are provided by acetal groups.

21. The method of claim 5, wherein the radiation has wavelengths shorter than 254 nm that cleaves the photocleavable junctions.

22. The method of claim 10, wherein the mild acid has a pKa higher than that of trifluoroacetic acid.

23. The method of claim 19, wherein the mild acid has a pKa higher than that of trifluoroacetic acid.

* * * * *

UNITED STATES PATENT AND TRADEMARK OFFICE
CERTIFICATE OF CORRECTION

PATENT NO. : 8,999,623 B2  
APPLICATION NO. : 13/831193  
DATED : April 7, 2015  
INVENTOR(S) : Padma Gopalan et al.

It is certified that error appears in the above-identified patent and that said Letters Patent is hereby corrected as shown below:

IN THE SPECIFICATION  
Col. 11, Line 12  
Delete "P(S-h-MMA)" and replace with -- P(S-b-MMA) --

Signed and Sealed this  
Ninth Day of August, 2016

Michelle K. Lee  
*Director of the United States Patent and Trademark Office*